May 29, 1956 A. A. GORSKI 2,748,282
BLOCKING OSCILLATOR CIRCUIT
Filed June 29, 1953

INVENTOR.
ALEXANDER A. GORSKI
BY
Brown, Denk & Synnestvedt
AGENTS

United States Patent Office 2,748,282

Patented May 29, 1956

2,748,282

BLOCKING OSCILLATOR CIRCUIT

Alexander A. Gorski, Palmyra, N. J., assignor to Philco Corporation, Philadelphia, Pa., a corporation of Pennsylvania Application June 29, 1953, Serial No. 364,589

10 Claims. (Cl. 250—36)

Figure 1:
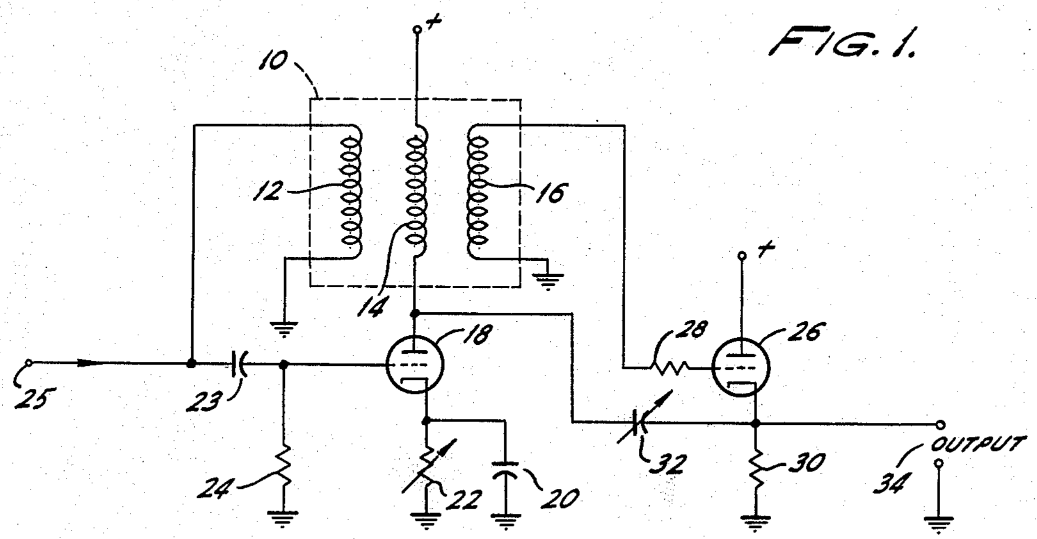

This invention relates to signal generators and more particularly to pulse generators of the blocking oscillator type.

Blocking oscillator circuits have been widely used for the generation of very narrow voltage pulses, for example of the order of 1 $\mu$-sec. duration. The known forms of blocking oscillator circuits include driven blocking oscillators, in which each output pulse is initiated by an input pulse, and free running blocking oscillator circuits in which the spacing between output pulses is determined by the time constant of a biasing circuit. In both of these forms of blocking oscillator circuits, the spacing between output pulses may readily be changed to suit the needs of the circuit designer. However, all forms of blocking oscillator circuits heretofore known in the art suffered from certain important disadvantages. In these prior known circuits, the duration of the blocking oscillator pulse depends mainly on the pulse transformer magnetizing inductance and, to a lesser extent, on the size of the capacitor which couples the pulse transformer to the grid of the electron tube in the blocking oscillator circuit. The value of the magnetizing inductance is determined by the construction of the core and the placement of the windings on the transformer, and cannot be changed readily once the transformer has been constructed. Therefore the duration of the pulses generated by circuits of the prior art cannot be changed readily.

It is an object of the present invention to provide an improved blocking oscillator circuit in which the duration of the generated pulse may readily be controlled.

It is a further object of the present invention to provide a novel blocking oscillator circuit in which the spacing between generated pulses and the duration of the generated pulses may be controlled separately.

Still another object of the present invention is to provide an improved blocking oscillator circuit having a low output impedance and a relatively large output signal amplitude.

In general, the invention comprises a pulse transformer having one winding thereof connected to the anode of a vacuum tube and a second winding connected to the grid of the same tube in the manner usually employed in constructing blocking oscillator circuits. An output winding of the pulse transformer is connected to the input of a cathode follower stage which serves both as the output circuit of the blocking oscillator and as part of the pulse width control circuit. The output of the cathode follower is connected back to the anode of the amplifier tube through a capacitor to complete the pulse width control circuit. The spacing between generated pulses is controlled by the bias at the cathode of the vacuum tube associated with the pulse transformer. In certain embodiments of the invention, the output signal amplitude is increased by connecting an input winding and an output winding of the pulse transformer in series in a manner hereinafter described in detail.

Figure 2:
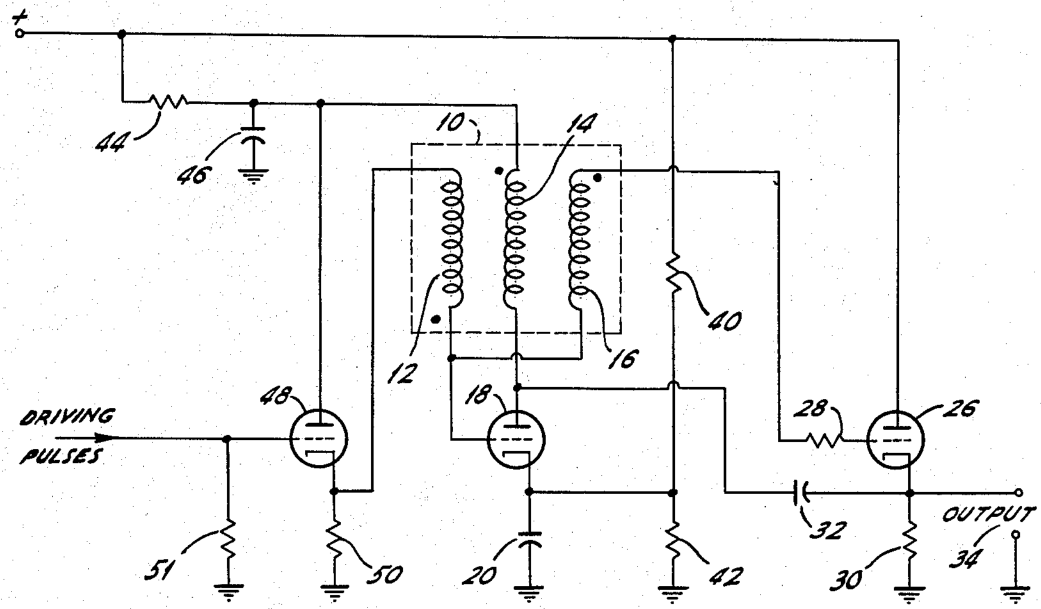

For a better understanding of the invention together with other and further objects thereof, reference should now be made to the following detailed description which is to be read in conjunction with the accompanying drawings in which:

Fig. 1 is a schematic diagram of a preferred embodiment of the present invention having separate pulse duration and pulse spacing controls; and Fig. 2 is a schematic diagram of a second preferred embodiment of the invention showing a second means for controlling the pulse spacing and a novel interconnection of the input and output circuits of the blocking oscillator to provide a larger output signal.

In Fig. 1, the blocking oscillator circuit comprises a pulse transformer 10 having an input or grid winding 12, an anode winding 14 and an output winding 16. Anode winding 14 is connected between a source of anode supply potential, schematically represented in Fig. 1 by the plus sign (+), and the anode of a vacuum tube 18. Preferably electron tube 18 is a triode type, having a control grid and cathode in addition to the anode mentioned above, but other types of electron tubes may be employed. The cathode of tube 18 is returned to ground through the parallel combination of a capacitor 20 and an adjustable resistor 22. Capacitor 20 should be relatively large so that a low A.-C. impedance exists between the cathode of tube 18 and ground during the generation of a pulse by the circuit shown in Fig. 1. Resistor 22 is selected to have a range of resistance values that will provide the desired variation in the spacing of the generated pulses. Grid winding 12 has one end thereof connected to the grid of tube 18 through a conventional resistor-capacitor coupling network 23—24, and the second end thereof connected to ground. The coupling network is provided with a terminal 25 to which synchronizing pulses may be supplied. The output winding 16 has one terminal thereof returned to ground and a second terminal connected to the control grid of a second electron tube 36 through a grid current limiting resistor 28. The anode of tube 26 is connected to a source of anode supply potential conventionally represented by the plus sign (+). In practice, a common anode supply source may be employed for tubes 18 and 26. The cathode of tube 26 is returned to ground through a load resistor 30. It will be recognized that tube 26 and resistor 30 together form a cathode follower stage. The cathode of tube 26 is connected back to the anode of tube 18 through an adjustable capacitor 32. The size of capacitor 32 is determined by the width of the pulse to be generated. For maximum control over the pulse width, capacitor 32 should be so constructed that the capacitance thereof may be varied from substantially zero to a value of the order of several hundred micromicrofarads. The circuit of Fig. 1 is provided with output terminals 34 connected across load resistor 30 from which the series of short duration voltage pulses of controllable duration and spacing may be obtained.

The circuit shown in Fig. 1 may be operated as a free running blocking oscillator, in which case no signal need be supplied to the grid of tube 18 by the way of terminal 25 and coupling network 23—24. When the circuit of Fig. 1 is operated as a free running blocking oscillator, the spacing between generated pulses is determined by the time constant of the grid circuit of tube 18 and by the potential at the cathode of this tube. The potential at the cathode of tube 18 will be equal to the average potential drop across resistor 22, which potential drop can be controlled by changing the value of resistor 22. During the generation of a pulse, capacitor 23 will accumulate a charge. At the termination of the pulse, the accumulated charge places the grid of tube 18 at a sufficiently negative potential with respect to the cathode to hold tube 18 in a non-conductive state for a period of time which may be of the order of several hundred microseconds. As capacitor 23 is discharged through resistor 24, the potential at the grid of tube 18 rises to the point at which conduction is initiated in tube 18. Windings 12 and 16 are so poled that the initiation of current flow through winding 14, as anode current begins to flow, results in a positive signal being coupled to the control grid of tube 18 by way of winding 12. The regenerative action which follows forces tube 18 into heavy conduction and forms the leading edge of the voltage pulse appearing at the anode of tube 18. It is generally believed that the duration of a pulse generated by a blocking oscillator is determined by the time required for the magnetizing current of the pulse transformer to increase to a value that saturates the vacuum tube associated therewith. When the point is reached at which the signal supplied to the control grid can no longer bring about an increase in anode current in tube 18 to supply the rising magnetizing current in transformer 10, the potential on the grid of tube 18 begins to fall and the resulting regenerative action rapidly terminates conduction in tube 18. This forms the trailing edge of the pulse generated by the blocking oscillator circuit.

I have found that, by feeding back a positive signal to the anode of tube 18 as the pulse is being generated, the time required for the tube 18 to reach saturation is increased. In the circuit of Fig. 1, this positive signal is obtained from the cathode load resistor 30 of tube 26 which receives a positive signal at its grid from output winding 16. It has been found that the duration of the pulse generated by the blocking oscillator circuit, including transformer 10 and tube 18, may be increased by at least a factor of 10 by the feedback supplied by way of capacitor 32, and that the amount of the increase is a function of the size of capacitor 32. The size of capacitor 32 controls the time constant of the feedback path and hence the period during which a positive signal is supplied to the anode of tube 18. The time duration of the generated pulse can be controlled to a certain extent by controlling the effective internal impedance of the source supplying the positive pulse to capacitor 32. Therefore capacitor 32 and resistor 22 control, respectively, the width of the generated pulses and the spacing between generated pulses. The wide range of control afforded by capacitor 32 should be contrasted with a maximum possible variation in pulse duration of the order of 20% in prior art circuits. It has been found that the feedback circuit including capacitor 32 has very little effect on the leading and trailing edges of the pulse. The output signal appearing across resistor 30 comprises a series of short, sharp voltage pulses having a duration of the order of a few microseconds, these pulses being spaced in time by an interval which may range from several microseconds to several hundred microseconds.

The operation of the circuit of Fig. 1 as a synchronized multivibrator is similar to the operation given above except that positive synchronizing pulses are supplied to the circuit by way of terminal 25. These synchronizing pulses will have no effect on the operation of the circuit until such time as the potential at the grid of tube 18 has risen to a point at which conduction is about to begin. At this point, the next positive synchronizing pulse will initiate conduction in tube 18 and the operation of the circuit will proceed in the manner described above.

Many modifications of the invention will occur to those skilled in the art. For example, if the circuit of Fig. 1 is to be employed as a free running blocking oscillator, the cathode bias circuit of tube 18 may be eliminated and the pulse spacing controlled by varying the time constant of the coupling network 23—24 associated with the grid of tube 18. The circuit of Fig. 1, with the cathode bias circuit removed, can also be operated as a synchronized multivibrator provided the natural period between output pulses is made slightly greater than the interval between driving pulses. An obvious modification of the circuit of Fig. 1 is to replace the cathode bias circuit with a known form of grid biasing means. The circuit of Fig. 1 may be modified to the extent of omitting winding 16 and coupling the grid of tube 26 to the anode of tube 18 through an amplifier which will convert the negative pulses appearing at the anode of tube 18 into positive pulses at the grid of tube 26.

In Fig. 2, transformer 10, tubes 18 and 26, capacitors 20 and 32 and resistors 28 and 30 correspond to similarly numbered elements in the circuit of Fig. 1. In the circuit of Fig. 2, resistor 22 has been replaced by a potential divider made up of resistors 40 and 42. This divider is connected across the anode supply source of tube 26. The cathode of tube 18 is connected to the junction of resistors 40 and 42. The divider circuit just described provides a fixed positive bias on the cathode of tube 18 to hold this tube in a non-conducting state until a driving pulse is supplied to the control grid thereof. In the circuit of Fig. 2, the winding 16 is not returned to ground as shown in Fig. 1 but is connected in series with winding 12. The junction of windings 12 and 16 is connected to the grid of tube 18, thus eliminating coupling network 23—24 of Fig. 1. This connection increases the amplitude of the output signal of the circuit of Fig. 2 in a manner which will be more fully described at a subsequent point in the specification. The anode supply for tube 18 is derived from the anode supply for tube 26 through a conventional decoupling filter composed of resistor 44 and capacitor 46. The function of this decoupling filter is to prevent fluctuations in the anode supply potential as a result of the heavy conduction through tube 18 during the generation of a pulse. Driving pulses for the circuit of Fig. 2 are supplied to the control grid of electron tube 48 which forms a part of a second cathode follower stage. These driving pulses appear across resistor 51. Tube 48 derives its anode supply potential from decoupling filter 44—46, but any other suitable source may be substituted. The cathode of tube 48 is returned to ground through load resistor 50. The end of winding 12 remote from the grid of tube 18 is connected to the cathode of tube 48.

The circuit of Fig. 2 operates in the following manner. In the absence of any driving pulses on the grid of tube 48, the cathode of tube 48 is only slightly positive with respect to ground. Therefore the grid of tube 18 is held substantially at ground potential by its connection to the cathode of tube 48 through winding 12. The cathode of tube 18 is held at a positive potential with respect to ground by the voltage divider 40—42 to which it is connected. This positive potential on the cathode biases tube 18 beyond cut-off. The potential at the cathode of tube 26 is fixed at a few volts above ground potential since the control grid of this tube is held at the slightly positive potential of the cathode of tube 48. The circuit of Fig. 2 is caused to generate an output pulse by supplying a positive driving pulse to the grid of tube 48. This driving pulse should be of sufficient amplitude to cause the rise in potential across resistor 50 to raise the grid of tube 18 above cut-off. When conduction occurs in tube 18, the generation of an output pulse occurs in the manner outlined above in connection with the description of Fig. 1.

Windings 12 and 16 are so poled that the signals induced therein by conduction through winding 14 add in phase when these two windings are connected in series in the manner shown in Fig. 2. Therefore winding 12 has the dual function of providing a regenerative signal to the grid of tube 18 and providing a fraction of the signal that is supplied to the grid of tube 26. This output signal is 1½ to 2 times the amplitude that would be obtained from winding 16 alone. It should be noted that there is a direct current path from the grid of tube 26 to the cathode of tube 48 through windings 12 and 16. Therefore no grid coupling network is required for tube 26.

Capacitor 32, which provides the feedback between the cathode of tube 26 and the anode of tube 18 to lengthen the duration of the generated pulse, may be variable if the duration of the pulse is to be varied or if precise control of the pulse width is required. Otherwise the proper value of this capacitor may be determined, either experimentally or analytically, and a fixed capacitor of the appropriate size may be used. The present invention is not to be limited to any particular set of values for the circuit components. However, by way of further explanation, a typical set of values for the circuit of Fig. 2 is given below:

| | |
|---|---|
| Anode supply potential | 300 volts. |
| Pulse transformer **10** | 1:1:1 ratio. |
| Tube **48** | ½ 12AX7. |
| Tube **18** | ½ 12AX7. |
| Tube **26** | 12AU7, two sections in parallel. |
| Resistors: | |
| **28** | 5,600 ohms. |
| **30** | 15,000 ohms. |
| **40** | 54,000 ohms. |
| **42** | 1,800 ohms. |
| **44** | 1,000 ohms. |
| **50** | 3,300 ohms. |
| **51** | 1,000 ohms. |
| Capacitors: | |
| **20** | .1 μf. |
| **32** | 0–300 μμf. |
| **46** | .1 μf. |

A circuit having the values given above will produce an output pulse the duration of which can be varied from approximately 0.5 microsecond to 5 microseconds or more.

The embodiments described above are believed to be the preferred forms of the present invention. However, it will be recognized that many minor modifications and changes may be made therein which fall clearly within the spirit and scope of the invention as defined by the hereinafter appended claims.

What is claimed is:

1. In a blocking oscillator circuit including an electron amplifier tube having at least an anode, a cathode and a control grid, a transformer regeneratively coupling the anode circuit of the electron tube so said control grid thereof and means for initiating anode current flow in said electron tube at spaced intervals of time to cause a negative voltage pulse to be generated at the anode of said electron tube, means for controlling the duration of said generated pulse comprising: means energized by said blocking oscillator circuit for generating a positive voltage pulse substantially in time coincidence with said negative pulse, and capacitive coupling means coupling the output of said positive pulse generating means to the anode of said blocking oscillator circuit.

2. In a blocking oscillator circuit including a transformer having one winding thereof in series with the anode-cathode path of an electron tube and a second winding thereof regeneratively connected to a control grid of said electron tube, and means for initiating anode current flow in said electron tube at preselected spaced intervals of time thereby to initiate the generation of correspondingly spaced pulses by said blocking oscillator circuit, means for controlling the duration of said generated pulses comprising: means for generating a positive going signal having an initial rise substantially coincident in time with the initiation of anode current flow in said electron tube, and capacitive means coupling the output of said last-mentioned signal generating means to the anode of said electron tube, thereby to impress said positive going signal on the anode circuit of said electron tube.

3. In a blocking oscillator circuit including an electron amplifier tube having at least an anode, a cathode and a control grid, a transformer having one winding thereof connected to the anode and in series with the anode-cathode path of said electron tube and a second winding thereof regeneratively connected to the control grid of said electron tube, and means for initiating anode current flow in said electron tube at preselected spaced intervals of time to cause negative voltage pulses to be generated at the anode of said electron tube, means for controlling the time duration of said negative pulses comprising: a cathode follower circuit, means associated with said blocking oscillator circuit for energizing said cathode follower circuit with positive voltage pulses occurring substantially in time coincidence with the generation of said negative pulses, and a capacitor connected from the output of said cathode follower circuit to the anode of said electron tube.

4. A blocking oscillator circuit comprising an electron amplifier tube having at least an anode, a cathode and a control grid, a transformer having a first winding thereof connected to said anode, said first winding being in series with the anode-cathode path of said electron tube and a second winding thereof regeneratively connected to the control grid of said electron tube, means for initiating anode current flow in said electron tube at preselected spaced intervals of time to cause negative voltage pulses to be generated at the anode of said electron tube, signal amplifier means energized by said first winding and constructed and arranged to provide positive voltage pulses occurring substantially in time coincidence with said negative voltage pulses, and a capacitor coupling the output of said signal amplifier means to the anode of said electron tube, the characteristic of said capacitor and said signal amplifier means being such that the charge on said capacitor changes substantially during the generation of a pulse.

5. A blocking oscillator circuit comprising an electron amplifier tube having at least an anode, a cathode and a control grid, a transformer having a first winding thereof connected to said anode, said first winding being in series with the anode-cathode path of said electron tube, a second winding thereof regeneratively connected to the control grid of said electron tube, and an output winding energized by current flow in said first winding, means for initiating anode current flow in said electron tube at preselected spaced intervals of time to cause negative voltage pulses to be generated at the anode of said electron tube, a cathode follower circuit, means connecting said output winding to the input of said cathode follower circuit, said output winding being poled to provide a positive signal to said cathode follower circuit, and a capacitor connected between the output of said cathode follower circuit and the anode of said electron tube.

6. A blocking oscillator circuit comprising an electron amplifier tube having at least an anode, a cathode and a control grid, means connecting said cathode and said control grid to points of fixed reference potential, a source of anode supply potential, a transformer having a grid winding, an anode winding and an output winding, said anode winding being connected between said anode and said source of anode supply potential, means connecting said grid winding in the grid-cathode circuit of said electron tube, said grid winding being poled to provide regenerative feedback from the anode circuit to the grid-cathode circuit of said electron tube, a cathode follower circuit, means connecting said output winding to the input of said cathode follower circuit, said output winding being poled to provide a positive pulse signal at the input of said cathode follower circuit, and a capacitor connected between the output of said cathode follower circuit and said anode.

7. A blocking oscillator circuit as defined by claim 6 wherein said capacitor is variable over a range of values including substantially zero capacitance.

8. A blocking oscillator circuit comprising an electron amplifier tube having at least an anode, a cathode and a control grid, means connecting said cathode and said control grid to points of fixed reference potential, a source of anode supply potential, a transformer having at least a grid winding and an anode winding, said anode winding being connected between said anode and said source of anode supply potential, means connecting said grid winding to the grid-cathode circuit of said electron tube, said grid winding being poled to provide regenerative feedback from the anode circuit to the grid-cathode circuit of said electron tube, a cathode follower circuit, means energized by said transformer for supplying a positive signal to said cathode follower circuit in time coincidence with the generation of a pulse by the blocking oscillator circuit, and a capacitor connected between the output of said cathode follower circuit and said anode.

9. A blocking oscillator circuit comprising an electron amplifier tube having at least an anode, a cathode and a control grid, means connecting said control grid and said cathode to points of fixed reference potential, said connecting means including means for biasing said control grid negatively with respect to said cathode, said bias means being adjustable to control the time spacing between generated pulses, a source of anode supply potential, a transformer having at least a grid winding and an anode winding, said anode winding being connected between said anode and said source of anode supply potential, means connecting one terminal of said grid winding to a point of fixed reference potential, means connecting a second terminal on said grid winding to said control grid, a cathode follower circuit, means energized by said transformer for supplying a positive pulse signal to said cathode follower circuit in time coincidence with the generation of a pulse by the blocking oscillator circuit, and a capacitor connecting the output of the cathode follower to the anode of said electron tube, said capacitor being adjustable to control the duration of the generated pulses.

10. A driven blocking oscillator circuit comprising an electron amplifier tube having at least a cathode, an anode and a control grid, means for biasing said cathode positively with respect to said grid, a transformer having a grid winding, an anode winding and an output winding, said anode winding being connected between said anode and a source of anode supply potential, a first terminal of said grid winding being connected to a first terminal of said output winding, said grid winding and said output winding being so poled that the signals induced therein combine additively, said first terminal of said grid winding being connected to said control grid, said grid winding being poled to provide regenerative feedback from the anode circuit to the control grid of said electron tube, a first cathode follower stage, a second terminal of said grid winding being connected to the output of said first cathode follower stage, means for supplying driving pulses to the input of said first cathode follower stage, a second cathode follower stage, a second terminal on said output winding being connected to the input of said second cathode follower stage, and a capacitor coupling the output of said second cathode follower stage to the anode of said electron amplifier tube, said capacitor providing a feedback path for increasing the time duration of the signal generated by said blocking oscillator circuit.

References Cited in the file of this patent

UNITED STATES PATENTS

| | | |
|---|---|---|
| 2,567,247 | Spalding | Sept. 11, 1951 |
| 2,605,404 | Valley | July 29, 1952 |
| 2,625,652 | Krulikoski et al. | Jan. 13, 1953 |